United States Patent
Torek et al.

(10) Patent No.: US 7,214,978 B2
(45) Date of Patent: May 8, 2007

(54) SEMICONDUCTOR FABRICATION THAT INCLUDES SURFACE TENSION CONTROL

(75) Inventors: Kevin Torek, Meridian, ID (US); Kevin Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/789,800

(22) Filed: Feb. 27, 2004

(65) Prior Publication Data

US 2005/0189575 A1 Sep. 1, 2005

(51) Int. Cl.
*H01L 27/108* (2006.01)

(52) U.S. Cl. ............. 257/296; 257/300; 438/239; 438/238; 438/706; 438/705

(58) Field of Classification Search ........... 257/296; 438/706
See application file for complete search history.

(56) References Cited

U.S. PATENT DOCUMENTS

| | | | |
|---|---|---|---|
| 5,344,525 A | 9/1994 | Cathey, Jr. | |
| 5,439,553 A | 8/1995 | Grant et al. | |
| 5,635,022 A | 6/1997 | Vaartstra | |
| 5,685,951 A | 11/1997 | Torek et al. | |
| 5,783,495 A | 7/1998 | Li et al. | |
| 5,922,624 A * | 7/1999 | Verhaverbeke et al. | ..... 438/743 |
| 5,990,019 A | 11/1999 | Torek et al. | |
| 6,090,683 A | 7/2000 | Torek | |
| 6,126,847 A | 10/2000 | Thakur et al. | |
| 6,153,358 A | 11/2000 | Zhang et al. | |
| 6,162,585 A | 12/2000 | Zhang et al. | |
| 6,194,286 B1 | 2/2001 | Torek | |
| 6,217,784 B1 | 4/2001 | Thakur et al. | |
| 6,235,145 B1 | 5/2001 | Li et al. | |
| 6,251,720 B1 * | 6/2001 | Thakur et al. | ............ 438/240 |
| 6,355,182 B2 | 3/2002 | Thakur et al. | |
| 6,385,020 B1 * | 5/2002 | Shin et al. | .................. 361/15 |
| 6,517,738 B1 | 2/2003 | Torek et al. | |
| 6,562,726 B1 | 5/2003 | Torek et al. | |
| 6,727,155 B1 * | 4/2004 | Yang et al. | ............... 438/366 |
| 6,783,695 B1 | 8/2004 | Torek et al. | |
| RE38,760 E | 7/2005 | Grant et al. | |

OTHER PUBLICATIONS

Ma, Y, "Vapor phase SiO2 etching and metallic contamination removal in an integrated cluster system", *Journal of Vacuum and Technology*, B 13(4), (Jul./Aug. 1996), 1460-1465.

* cited by examiner

*Primary Examiner*—Tu-Tu Ho
(74) *Attorney, Agent, or Firm*—Schwegman, Lundberg, Woessner & Kluth, P.A.

(57) ABSTRACT

In one embodiment, a method includes providing a semiconductor substrate that includes a memory container having a double-sided capacitor. The method also includes vapor phase etching a layer adjacent to the side wall of the memory container with a vapor having a surface tension lowering agent.

44 Claims, 8 Drawing Sheets

SEMICONDUCTOR FABRICATION THAT INCLUDES SURFACE TENSION CONTROL

FIELD OF THE INVENTION

The present invention relates generally to the field of semiconductor fabrication, and more particularly to semiconductor fabrication that includes surface tension control.

BACKGROUND

Semiconductors are used extensively in today's electronic devices. Their miniature size and low power requirements enable highly complex circuits to be used in places never before thought possible. This has led to the development of systems with the speed and power to make our lives easier without encumbering us with bulky boxes and power-hungry electronics. One of the keys to both light weight and energy efficiency is the tiny size of the circuitry. With each new generation of circuit technology, comes smaller and smaller device sizes.

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor includes two conductive plates. The top plate of each capacitor is typically shared, or common, with each of the other capacitors. This plate is referred to as the "top cell plate." The charge stored across the capacitor is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. Thus, each such memory cell has two digit lines, digit and digit complement.

Typically, the memory cells are arranged in an array and each cell has an address identifying its location in the array. The array includes a configuration of intersecting conductive lines, and memory cells are associated with the intersections of the lines. In order to read from or write to a cell, the particular cell in question must be selected, or addressed. The address for the selected cell is represented by input signals to a word line decoder and to a digit line decoder. The word line decoder activates a word line in response to the word line address. The selected word line activates the access transistors for each of the memory cells in communication with the selected word line. The digit line decoder selects a digit line pair in response to the digit line address. For a read operation, the selected word line activates the access transistors for a given word line address, and data is latched to the digit line pairs.

Some circuit devices utilize "container" structures, and such container structures are often utilized as a capacitor for a memory cell due to their efficient use of semiconductor die real estate. After formation, these container structures look like tiny holes within the surrounding material. They will generally have a closed bottom, an open top and side walls extending between the closed bottom and open top. Typically, containers that will be formed into capacitor structures will have dimensions that are taller than they are wide, often referred to as a "high aspect-ratio." This high aspect-ratio of container capacitors can allow the capacitor to store more energy while maintaining the same two-dimensional surface area.

However, capillary forces may cause the container structures of the memory array to lean and/or stick together. In particular, because of the proximity of these container structures, surface tension (caused by the capillary forces) caused by liquids used for the removal of certain materials (e.g., an oxide) during fabrication may cause the container structures to be pulled together. For example, the liquid used during a wet etch operation to remove an oxide may introduce such capillary forces into the fabrication of the memory array.

For the reasons stated above, for other reasons stated below, and for other reasons which will become apparent to those skilled in the art upon reading and understanding the present specification, there is a need in the art an improved methods, apparatuses and systems for semiconductor fabrication.

SUMMARY

Methods, apparatuses and systems for semiconductor fabrication that includes surface tension control are described. In one embodiment, a method includes providing a semiconductor substrate that includes a memory container having a double-sided capacitor. The method also includes vapor phase etching a layer adjacent to the side wall of the memory container with a vapor having a surface tension lowering agent.

In one embodiment, there is a method of fabricating a semiconductor substrate. The method includes placing a semiconductor substrate that includes a double-sided capacitor container in a chamber. The method also includes vapor phase etching a layer adjacent to a side wall of the double-sided capacitor container with a vapor that includes hydrogen fluouride, an etch initiator composition and an alcohol.

In an embodiment, there is a method of fabricating an integrated circuit. The method includes housing the integrated circuit in a vapor etch chamber. The method also includes vapor phase etching an insulator layer formed adjacent to a double-sided capacitor container in the integrated circuit. The vapor phase etching of the oxide layer comprises inserting a vapor comprised of a hydrogen fluoride and isopropyl alcohol into the vapor etch chamber.

In one embodiment, a method includes placing a substrate that includes an array of memory into a chamber. The array of memory has at least one memory container with a side wall with an embedded capacitor. The method also includes vapor phase etching of a layer of an insulator material formed adjacent to the side wall. The vapor phase etching comprises mixing a hydrogen fluoride and an isopropyl alcohol to form a mixed vapor. The vapor phase etching also includes inserting the mixed vapor into the chamber.

In an embodiment, there is a method for fabricating a semiconductor substrate. The method includes placing the semiconductor substrate that includes a memory container into a vapor etching chamber. A side wall of the memory container includes a double-sided capacitor. The method also includes vapor phase etching of a layer of an insulator material formed adjacent to the side wall of the memory container. The vapor phase etching includes mixing an the etch initiator composition, hydrogen fluoride and alcohol to form a mixed vapor. The vapor phase etching also includes heating the mixed vapor. The vapor phase etching includes inserting the mixed vapor into the vapor etching chamber.

In one embodiment, a method includes placing a semiconductor substrate into a chamber. The method also includes vapor phase etching of an insulator material formed adjacent to a double-sided container on a semiconductor substrate. The vapor phase etching comprises forming a vapor that includes an etch initiator composition, an HF gas and a surface tension lowering agent. The vapor phase etching also includes inserting the vapor into the chamber.

In an embodiment, there is a method for fabricating a memory array. The method includes forming at least one memory container in a borophosphosilicate glass (BPSG) material on a substrate. A side wall of the at least one memory container includes a double-sided capacitor. The method also includes removing at least a part of the BPSG material based on a vapor wet etch operation with a vapor comprised of hydrogen fluoride and alcohol.

In one embodiment, a method includes forming at least one memory container in an oxide, wherein a side wall of the at least one memory container includes a double-sided capacitor. The method also includes vapor wet etching of a layer of the oxide with a vapor comprised of hydrogen fluoride, $H_2O$ and a surface tension lowering agent.

In an embodiment, a vapor phase etching system includes an etch initiator composition source, a hydrogen fluoride source and a surface tension lowering agent source. The vapor phase etching system also includes a heater to receive an etch initiator composition from the etch initiator composition source, hydrogen fluoride from the hydrogen fluoride source and a surface tension lowering agent from the surface tension lowering agent source. The heater heats the etch initiator composition, the hydrogen fluoride and the surface tension lowering agent to form a mixed vapor. The vapor phase etching system also includes a chamber to house a semiconductor substrate that includes at least one memory container. A side wall of the at least one memory container includes a double-sided capacitor that is adjacent to an insulator layer. The mixed vapor is to be inserted into the chamber.

In one embodiment, a system includes a processor to execute a number of instructions. The system also includes a memory to store at least a part of the number of instructions. The memory has a number of memory cells, wherein the number of memory cells includes a double-sided capacitor fabricated in a side wall of a memory container. The number of memory cells are fabricated by forming the memory container in an oxide. The number of memory cells are also fabricated by vapor wet etching of a layer of the oxide with a vapor comprised of a hydrogen fluoride, an etch initiator composition and a surface tension lowering agent.

In an embodiment, an integrated circuit device comprises a first memory container having a side wall that includes a double-sided capacitor. The integrated circuit device includes a second memory container having a side wall that includes a double-sided capacitor. The first memory container and the second memory container are formed by vapor phase etching, with a vapor, an oxide layer between the side wall of the first memory container and the side wall of the second memory container. The vapor includes a surface tension lowering agent.

In one embodiment, a memory device comprises an array of memory cells formed within a number of memory containers. A side wall of at least one of the number of memory containers has a double-sided capacitor. The at least one of the number of memory containers is formed by vapor phase etching a layer adjacent to the side wall with a vapor that includes a surface tension lowering agent.

In an embodiment, an integrated circuit comprises a substrate. The integrated circuit includes a memory container formed on the substrate by forming the memory container in a borophosphosilicate glass (BPSG) material on the substrate, wherein a side wall of the memory container includes a double-sided capacitor. The memory container is also formed on the substrate by removing at least a part of the BPSG material based on a vapor wet etch operation with a vapor comprised of a hydrogen fluoride gas and an alcohol.

In one embodiment, an array of memory cells comprises a substrate. The array of memory cells also includes a structure having a side wall that includes a double-sided capacitor. The structure is formed on the substrate by vapor phase etching a layer adjacent to the side wall with a vapor that includes methanol.

In an embodiment, a memory includes a substrate. The memory includes a number of memory containers having side walls that includes a double-sided capacitor. The number of memory containers are formed on the substrate by etching an insulator layer adjacent to the side walls with a vapor that includes a hydrogen fluoride gas, an $H_2O$ vapor and a surface tension lowering agent.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

Embodiments of the invention may be best understood by referring to the following description and accompanying drawings which illustrate such embodiments. The numbering scheme for the Figures included herein are such that the leading number for a given reference number in a Figure is associated with the number of the Figure. For example, a memory array 100 can be located in FIG. 1. However, reference numbers are the same for those elements that are the same across different Figures. In the drawings.

DETAILED DESCRIPTION

Figure 1:
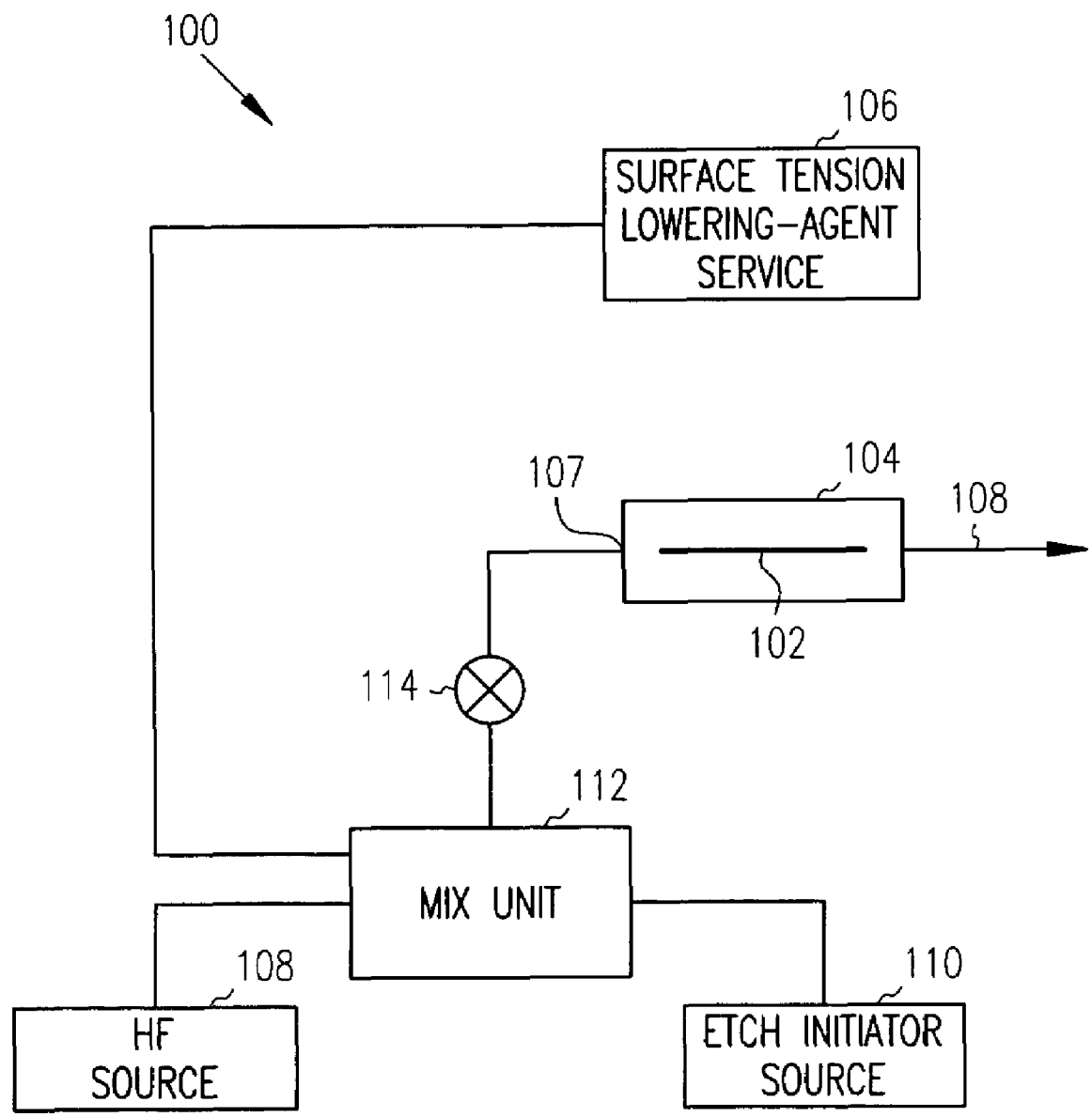
FIG. 1 illustrates a system for semiconductor fabrication that includes surface tension control, according to one embodiment of the invention.

Methods, apparatuses and systems for different embodiments for semiconductor fabrication that includes surface tension control are described. In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention.

While described with reference to memory containers for fabrication of a memory array, embodiments of the invention may be used for fabrication of any other type of integrated circuit. For example, embodiments of the invention may be used to fabricate other circuits, wherein the proximity of the structures are such that capillary forces may cause the structures to lean and/or stick together. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents. It is noted that for purposes of interpreting this disclosure and the claims that follow, the spacial reference terms "on", "over", "above", "beneath" and the like are utilized to describe relative orientations of various elements to one another. The terms are not utilized in an absolute and global sense relative to any external reference. Accordingly, a first material recited as being "beneath" a second material defines a reference of the two materials to one another, but does not mean that the first material would actually be "under" the second material relative to any reference external of the two materials.

References in the specification to "one embodiment", "an embodiment", "an example embodiment", etc., indicate that the embodiment described may includes a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIG. 1 illustrates a system for semiconductor fabrication that includes surface tension control, according to one embodiment of the invention. In particular, FIG. 1 illustrates a system 100 that includes a vapor etch chamber 102 that may house a semiconductor substrate 104. As further described in more detail below, the semiconductor substrate 104 includes a layer/material that is to be vapor phase etched. In one embodiment, the semiconductor substrate 104 includes a memory container having a side wall that includes a double-sided capacitor. In an embodiment, the semiconductor substrate 104 includes an array of memory cells that are formed in a number of memory containers.

The vapor etch chamber 102 includes an inlet 107 and an outlet 108. A hydrogen fluoride (HF) source 108 is coupled to input a hydrogen fluoride substance into a mix unit 112. In one embodiment, the hydrogen fluoride source 108 inputs an HF gas into the mix unit 112. In some embodiments, the system 100 may include an etch initiator source 110 (as shown) to input an etch initiator composition into the mix unit 112. The etch initiator composition allows for a more uniform etching across the semiconductor substrate 104 at about the time. In some embodiments, etch initiation is not used. Etch initiator compositions may include different forms of $H_2O$ (e.g., an $H_2O$ vapor), methanol, acetic acid, different types of ethers, acetone, carboxylic acid, etc.

Alternatively to the system 100, the etch initiator composition may be applied outside of the mix unit 112. For example, the etch initiator composition may be applied prior to the semiconductor substrate 104 being housed in the vapor etch chamber 102. In addition or alternative to the use of an etch initiator composition, ultraviolet light could be applied to the surface of the semiconductor substrate 104 to allow for the more uniform etching of the surface.

In an embodiment, the etch initiator source 110 inputs an etch initiator composition into the mix unit 112. A surface tension lowering agent source 106 is coupled to input a surface tension lowering agent into mix the unit 112. The surface tension lowering agent is introduced into the vapor to lower the surface tension on the surface of the layer being etched. The thickness of the adsorbed layer of etchant on the surface of the layer being etched may therefore be thicker in comparison to the thickness maintained during conventional etching processes.

In an embodiment, the surface tension lowering agent includes an alcohol. In one embodiment, the surface tension lowering agent includes an isopropyl alcohol. In an embodiment, the surface tension lowering agent includes a methanol. In one embodiment, the surface tension lowering agent includes carboxylics. In an embodiment, the surface tension lowering agent includes an acetic acid. In one embodiment, the surface tension lowering agent includes trifluoroacetic acid. Moreover, the surface tension lowering agent may comprise a combination of these different embodiments. For example, the surface tension lowering agent may include a combination of isopropyl alcohol and methanol.

The mix unit 112 may mix the HF gas, the etch initiator composition and the surface tension lowering agent to form a mixed vapor. In one embodiment, the mix unit 112 heats the HF, the etch initiator composition and the surface tension lowering agent to generate a mixed vapor. In one embodiment, the surface tension lowering agent is approximately 10% of the mixed vapor. In an embodiment, the surface tension lowering agent is approximately 30% of the mixed vapor. However, embodiments of the invention are not limited to such percentages as the surface tension lowering agent may be a greater or lesser percentage of the mixed vapor.

The mix unit 112 is coupled to a valve 114. The valve 114 is coupled to the inlet 107. Accordingly, the valve 114 (when opened) releases the mixed vapor into the vapor etch chamber 102. As described in more detail below, the mixed vapor etches at least one layer of the semiconductor substrate 102. Moreover, the surface tension lowering agent combines with the product of the vapor etch operation to generate an adsorbed layer on the surface of the layer being etched.

Embodiments of the invention are not limited to the system 100 illustrated in FIG. 1. For example, in an embodiment, the mix unit 112 is not used. Accordingly, the HF source 108, the etch initiator source 110 and the surface tension lowering agent source 106 are coupled directly to the valve 114. In another embodiment, the surface tension lowering agent source 106 is coupled to directly input the surface tension lowering agent directly into the vapor etch chamber 104, while the HF source 108 and the etch initiator source 110 are coupled to the mix unit 112 to allow for premixing of the HF with the etch initiator composition. In an embodiment, the system 100 may not include the etch initiator source 110. Accordingly, the mixed vapor may be a combination of an HF gas and a surface tension lowering agent in a vapor form.

Figure 2:
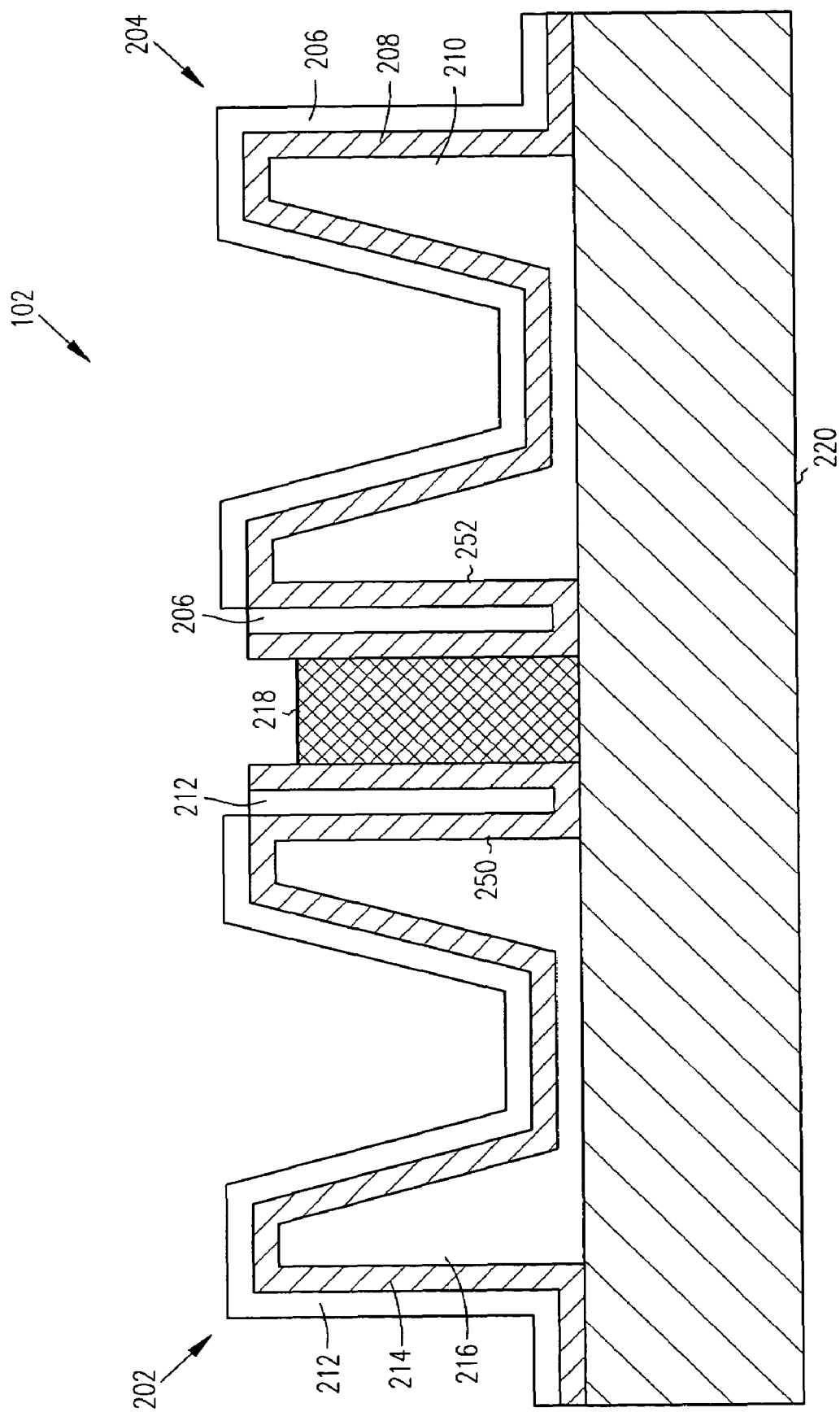
FIG. 2 illustrates a semiconductor substrate, according to one embodiment of the invention.

A more detailed description of the vapor phase etching is now described with reference to FIGS. 2–4. FIG. 2 illustrates a semiconductor substrate, according to one embodiment of the invention. FIG. 2 illustrates one embodiment of the semiconductor substrate 102. The semiconductor substrate 102 includes a first memory container 202 and a second memory container 204 formed on a substrate 220. While the first memory container 202 and the second memory container 204 may have a number of different aspect ratios, in one embodiment, the first memory container 202 or the second memory container 204 has an aspect ratio of 10:1. In an embodiment, the first memory container 202 or the second memory container 204 has an aspect ratio of 13:1.

The first memory container 202 and the second memory container 204 are formed in an insulator material 218 on the substrate 220 using techniques well known in the art, including masking, doping, etching, deposition, etc., or any combination thereof. Moreover, the first memory container 202, the second memory 204 and the substrate 220 may be formed from a number of different materials known in the art.

In one embodiment, the insulator material 218 is an oxide. In an embodiment, the insulator material 218 is a doped oxide. In one embodiment, the insulator material 218 includes silicon oxide. In an embodiment, the insulator material 218 includes silicon nitride. In one embodiment, the insulator material 218 includes a silicon oxynitride.

The first memory container 202 includes a lower capacitor plate 216, and the second memory container 204 includes a lower capacitor plate 210. The first memory container 202 includes a dielectric layer 214 formed on the lower capacitor plate 216. The second memory container 204 includes a dielectric layer 208 formed on the lower capacitor plate 210. The first memory container 202 includes an upper capacitor plate 212 formed on the dielectric layer 214. The second memory container 204 includes an upper capacitor plate 206 formed on the dielectric layer 208.

As shown, the first memory container 202 includes a side wall 250 having a doubled-sided capacitor. In particular, the double-sided capacitor includes the lower capacitor plate 216 surrounded on two sides by the upper capacitor plate 212. The second memory container 204 includes a side wall 252 having a double-sided capacitor. In particular, the double-sided capacitor includes the lower capacitor plate 210 surrounded on two sides by the upper capacitor plate 206.

Figure 3:
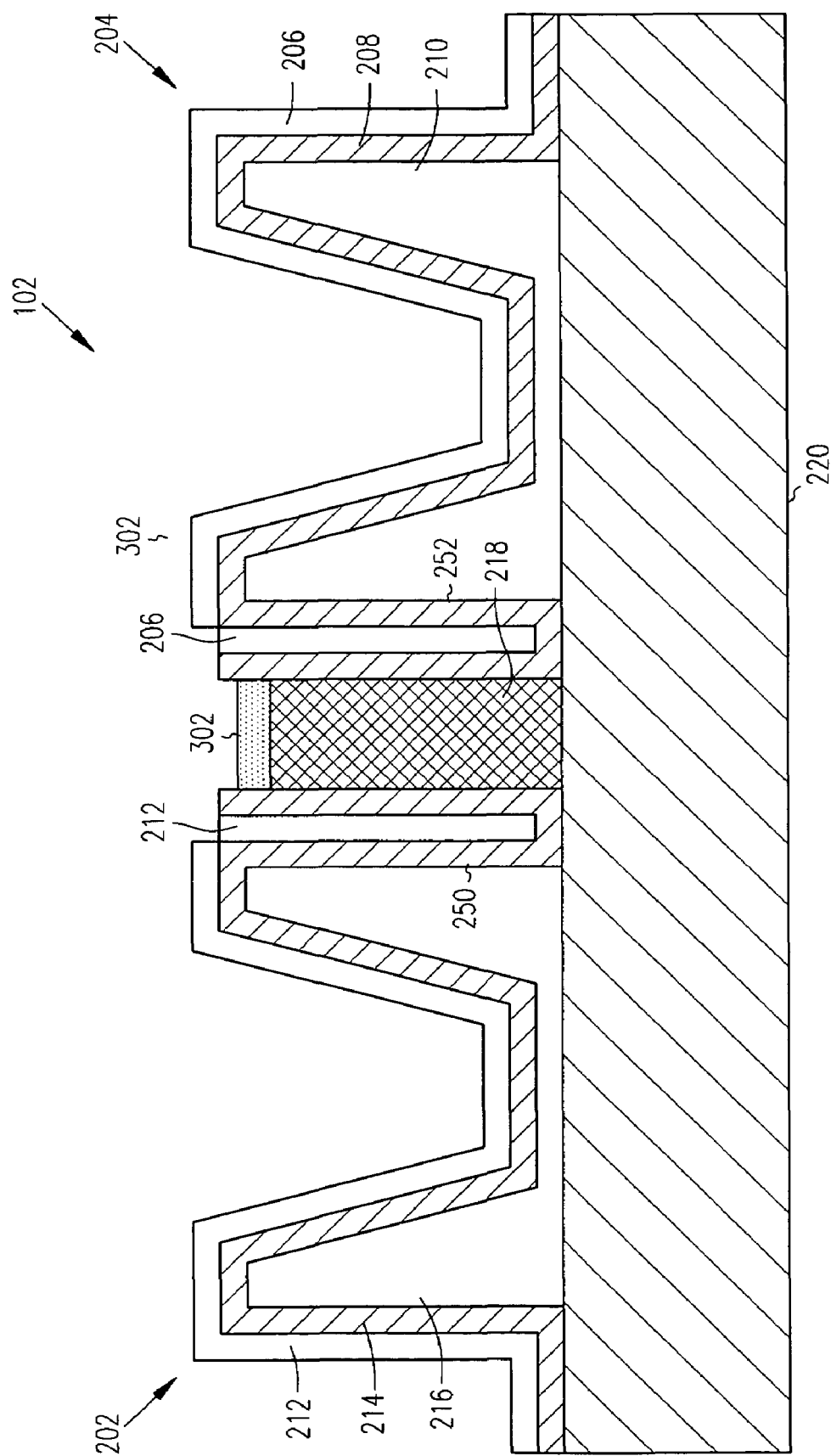
FIG. 3 illustrates a fabrication of the semiconductor substrate of FIG. 2 at a first stage, according to one embodiment of the invention.

FIG. 3 illustrates a fabrication of the semiconductor substrate of FIG. 2 at a first stage, according to one embodiment of the invention. As shown, the semiconductor substrate 102 is surrounded by a mixed vapor 310. A vapor phase etch operation is performed to remove the insulator material 218 using the mixed vapor 310. The mixed vapor may be comprised of a number of different substances in combination with a surface tension lowering agent (as described above in conjunction with FIG. 1 above). As shown, an adsorbed layer 302 is formed on the top of the insulator material 218. The adsorbed layer 302 includes the surface tension lowering agent in combination of the results of the vapor phase etch.

Figure 4:
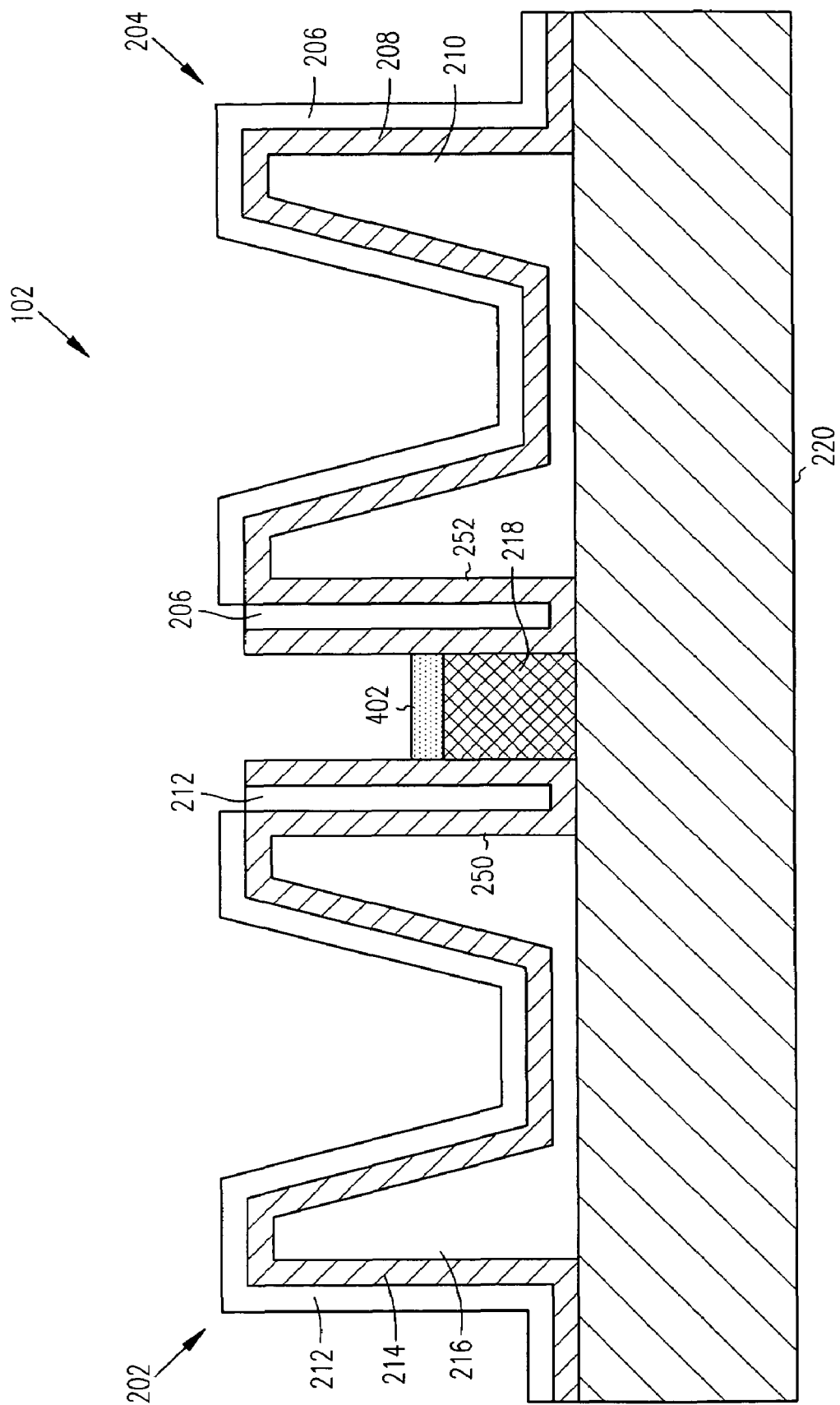
FIG. 4 illustrates a fabrication of the semiconductor substrate of FIG. 2 at a second stage, according to one embodiment of the invention.

FIG. 4 illustrates a fabrication of the semiconductor substrate of FIG. 2 at a second stage, according to one embodiment of the invention. As shown, the semiconductor substrate 102 is surrounded by the mixed vapor 310. The vapor phase etch operation continues to remove the insulator material 210 using the mixed vapor 310. The adsorbed layer 302 remains on the top of the insulator material 218.

Memory Devices

Figure 5:
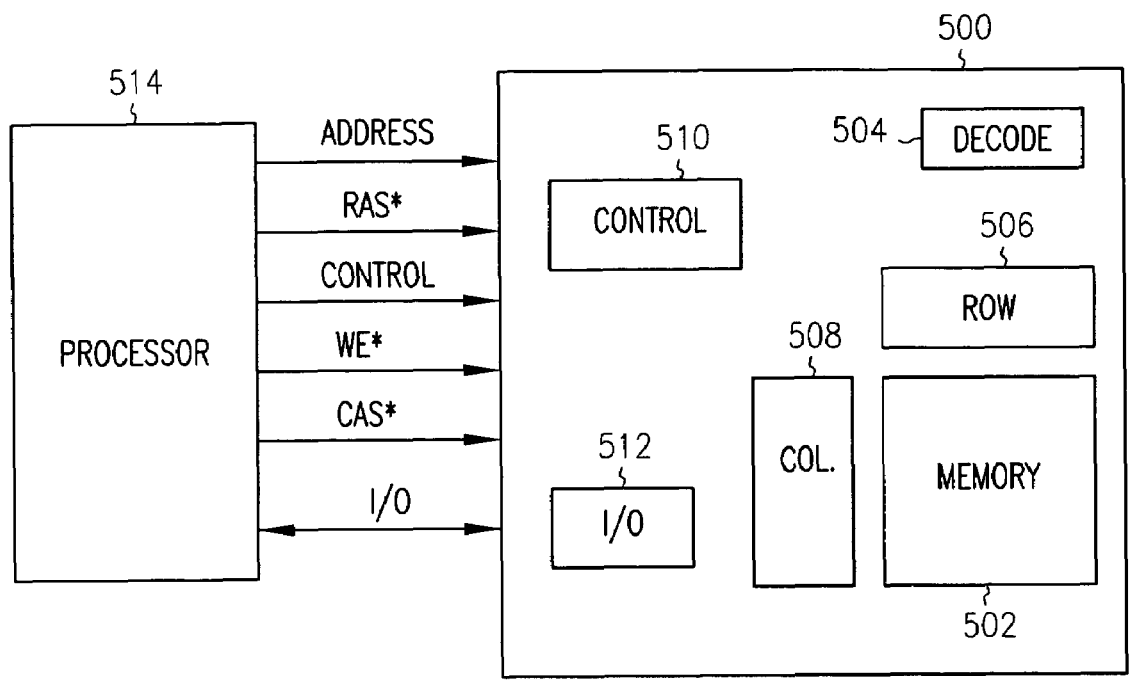
FIG. 5 is a simplified block diagram of a memory device, according to one embodiment of the invention.

FIG. 5 is a simplified block diagram of a memory device, according to one embodiment of the invention. FIG. 5 illustrates a memory device 500 includes an array of memory cells 502, an address decoder 504, a row access circuitry 506, a column access circuitry 508, a control circuitry 510, and an Input/Output (I/O) circuit 512. The memory device 500 is operably coupled to an external processor 514, or memory controller (not shown) for memory accessing. The memory device 500 receives control signals from the processor 514, such as WE*, RAS* and CAS* signals. The memory device 500 stores data which is accessed via I/O lines. It will be appreciated by those skilled in the art that additional circuitry and control signals can be provided, and that the memory device of FIG. 5 has been simplified to help focus on embodiments of the invention. At least one of the memory cells, transistors, or associated circuitry has an integrated circuit structure or element in accordance with embodiments of the invention. For example, the array of memory cells 502 may be fabricated according to embodiments of the invention.

It will be understood that the above description of a memory device is intended to provide a general understanding of the memory and is not a complete description of all the elements and features of a specific type of memory, such as DRAM (Dynamic Random Access Memory). Further, the embodiments of the invention are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Semiconductor Dies

Figure 6:
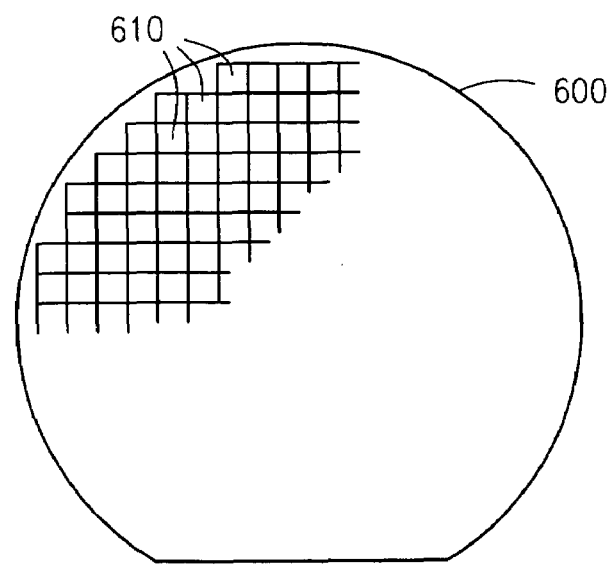
FIG. 6 illustrates a semiconductor die, according to one embodiment of the invention.

FIG. 6 illustrates a semiconductor die, according to one embodiment of the invention. As shown, a semiconductor die 610 is produced from a wafer 600. The semiconductor die 610 is an individual pattern, typically rectangular, on a substrate or wafer 600 that contains circuitry, or integrated circuit devices, to perform a specific function. The semiconductor wafer 600 will typically contain a repeated pattern of such semiconductor dies 610 containing the same functionality. The semiconductor die 610 is typically packaged in a protective casing (not shown) with leads extending therefrom (not shown) providing access to the circuitry of the die for unilateral or bilateral communication and control. The semiconductor die 610 may include an integrated circuit structure or element in accordance with embodiments of the invention.

Circuit Modules

Figure 7:
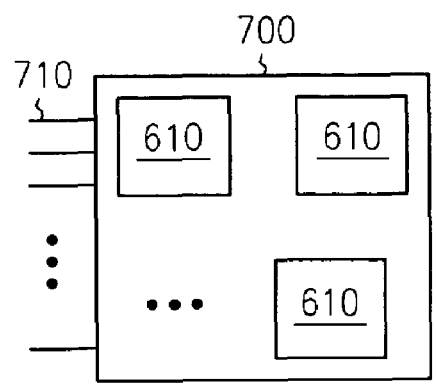
FIG. 7 illustrates a circuit module, according to one embodiment of the invention.

FIG. 7 illustrates a circuit module, according to one embodiment of the invention. As shown in FIG. 7, two or more semiconductor dies 610 may be combined, with or without protective casing, into a circuit module 700 to enhance or extend the functionality of an individual semiconductor die 610. The circuit module 700 may be a combination of semiconductor dies 610 representing a variety of functions, or a combination of semiconductor dies 610 containing the same functionality. One or more semiconductor dies 610 of circuit module 700 may contain at least one integrated circuit structure or element in accordance with embodiments of the invention.

Some examples of a circuit module include memory modules, device drivers, power modules, communication modems, processor modules and application-specific modules, and may include multilayer, multichip modules. The circuit module 700 may be a subcomponent of a variety of electronic systems, such as a clock, a television, a cell phone, a personal computer, an automobile, an industrial control system, an aircraft and others. The circuit module 700 may have a variety of leads 710 extending therefrom and coupled to the semiconductor dies 610 providing unilateral or bilateral communication and control.

Figure 8:
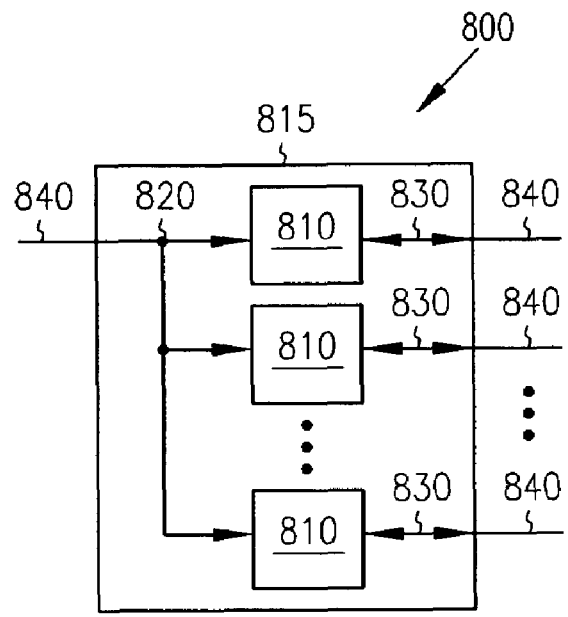
FIG. 8 illustrates a circuit module as a memory module, according to one embodiment of the invention.

FIG. 8 illustrates a circuit module as a memory module, according to one embodiment of the invention. A memory module 800 contains multiple memory devices 810 contained on a support 815 (the number generally depending upon the desired bus width and the desire for parity). The memory module 800 accepts a command signal from an external controller (not shown) on a command link 820 and provides for data input and data output on data links 830. The command link 820 and data links 830 are connected to leads 840 extending from the support 815. The leads 840 are shown for conceptual purposes and are not limited to the positions shown in FIG. 8. At least one of the memory devices 810 may contain an integrated circuit structure or element in accordance with embodiments of the invention.

Electronic Systems

Figure 9:
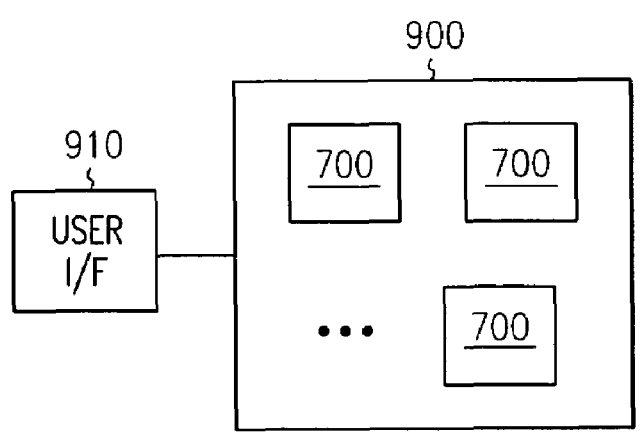
FIG. 9 illustrates a block diagram of an electronic system, according to one embodiment of the invention.

FIG. 9 illustrates a block diagram of an electronic system, according to one embodiment of the invention. FIG. 9 shows one embodiment of an electronic system 900 containing one or more circuit modules 700. The electronic system 900 generally contains a user interface 910. The user interface 910 provides a user of the electronic system 900 with some form of control or observation of the results of the electronic system 900. Some examples of the user interface 910 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine, or other human-machine interfaces. The user interface 910 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 710, or of other information either preprogrammed into, or otherwise provided to, electronic system 900. As will be apparent from the lists of examples previously given, the electronic system 900 will often be associated with certain mechanical components (not shown) in addition to the circuit modules 700 and the user interface 910. It will be appreciated that the one or more circuit modules 700 in the electronic system 900 can be replaced by a single integrated circuit. Furthermore, the electronic system 900 may be a subcomponent of a larger electronic system. It will also be appreciated that at least one of the memory modules 700 may contain an integrated circuit structure or element in accordance with embodiments of the invention.

Figure 10:
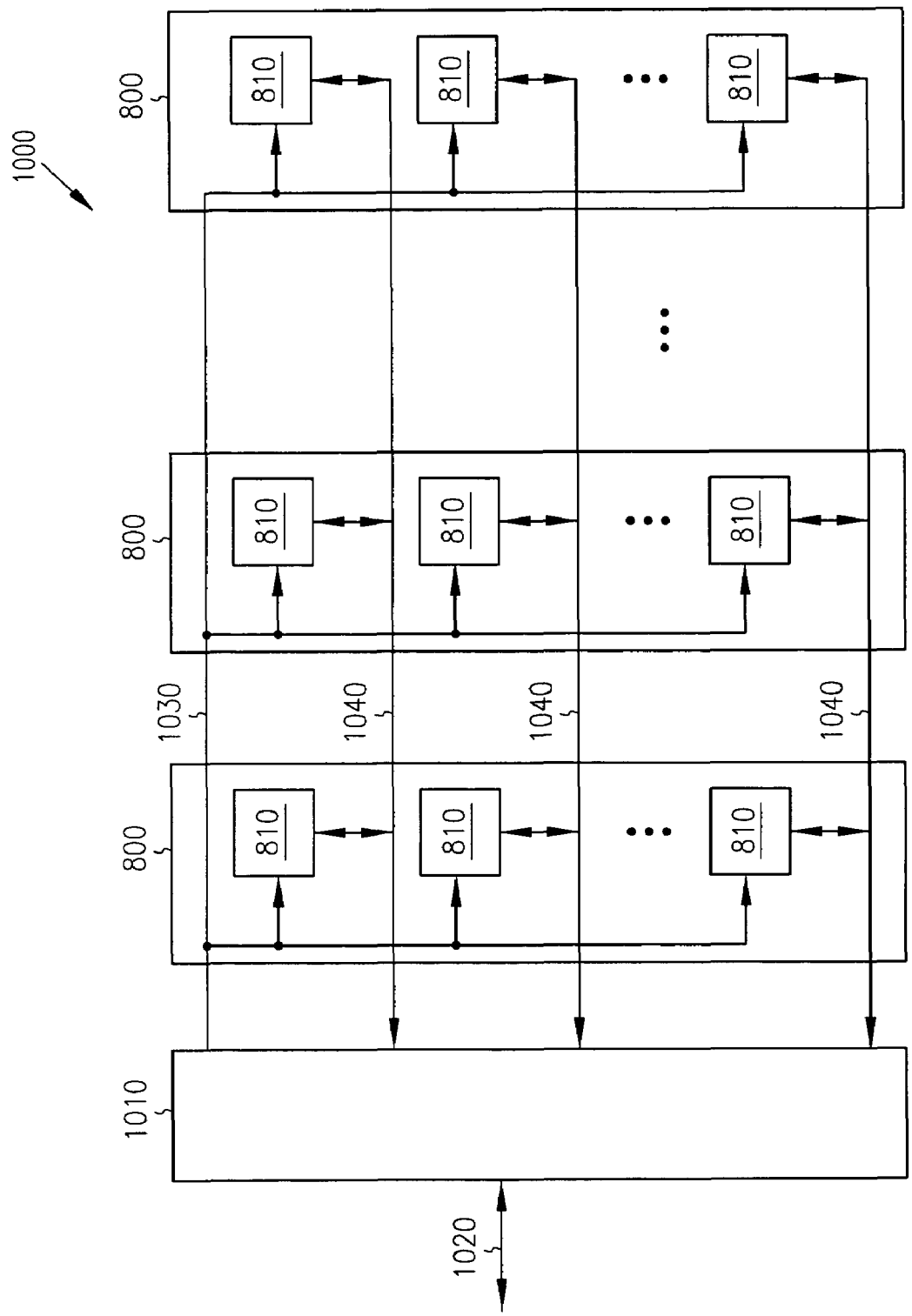
FIG. 10 illustrates a block diagram of an electronic system as a memory system, according to one embodiment of the invention.

FIG. 10 illustrates a block diagram of an electronic system as a memory system, according to one embodiment of the invention. A memory system 1000 contains one or more memory modules 800 and a memory controller 1010. The memory modules 800 each contain one or more memory devices 810. At least one of memory devices 810 may contain an integrated circuit structure or element in accordance with embodiments of the invention.

The memory controller 1010 provides and controls a bidirectional interface between the memory system 1000 and an external system bus 1020. In an embodiment, the memory controller 1010 may contain an integrated circuit structure or element in accordance with embodiments of the invention. The memory system 1400 accepts a command signal from the external system bus 1020 and relays it to the one or more memory modules 800 on a command link 830. The memory system 1000 provides for data input and data output between the one or more memory modules 800 and the external system bus 1020 on data links 1040.

Figure 11:
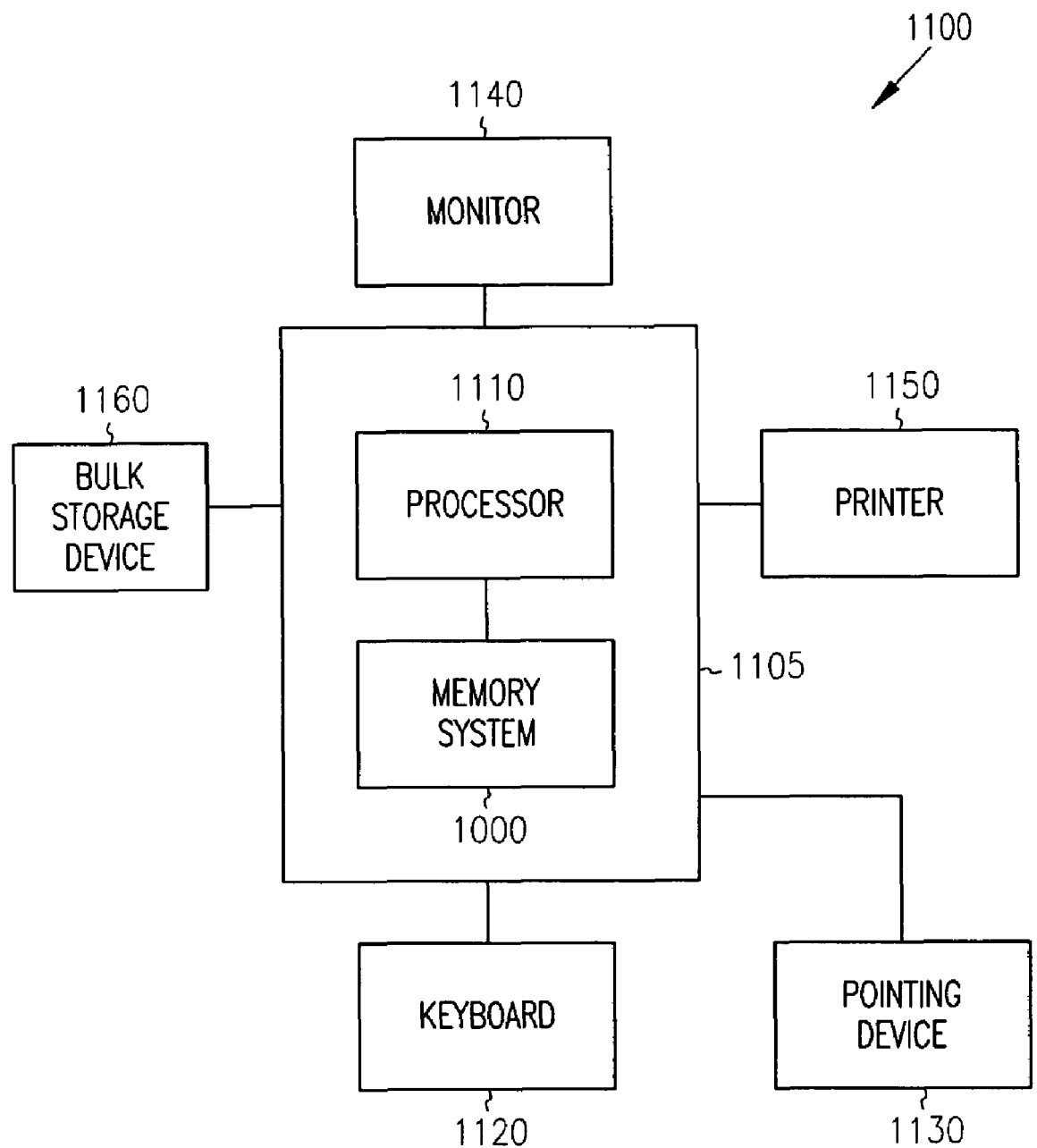
FIG. 11 illustrates a block diagram of an electronic system as a computer system, according to one embodiment of the invention.

FIG. 11 illustrates a block diagram of an electronic system as a computer system, according to one embodiment of the invention. A computer system 1100 contains a processor 1110 and a memory system 1000 housed in a computer unit 1105. The computer system 1100 is but one example of an electronic system containing another electronic system, i.e., memory system 1000, as a subcomponent. The computer system 1100 optionally contains user interface components. Depicted in FIG. 11 are a keyboard 1120, a pointing device 1130, a monitor 1140, a printer 1150 and a bulk storage device 1160. It will be appreciated that other components are often associated with the computer system 1100 such as modems, device driver cards, additional storage devices, etc. It will further be appreciated that the processor 1110 and the memory system 1000 of computer system 1100 can be incorporated on a single integrated circuit. Such single package processing units reduce the communication time between the processor and the memory circuit. It will be appreciated that at least one of the processor 1110 and the memory system 1000 may contain an integrated circuit structure or element in accordance with embodiments of the invention. In an embodiment, the printer 1150 or the bulk storage device 1160 may contain an integrated circuit structure or element in accordance with embodiments of the invention.

CONCLUSION

Thus, methods, apparatuses and systems for different embodiments for semiconductor fabrication that includes surface tension control have been described. As illustrated, embodiments of the invention allow for a faster etch rate in comparison to conventional vapor phase etch operations. For example, in one embodiment, a vapor phase etch operation is performed on a material adjacent to a memory container having a side wall that includes a double-sided capacitor. As described above, such a container includes fine structures which are relatively close together that need to remain isolated from each other. Accordingly, alterations/ damages (such as bending) of this side wall needs to be reduced in order to preclude the structures therein from bending and/or coming into contact with each other. As described above, embodiments of the invention introduce a surface tension lowering agent into the vapor, thereby lowering the surface tension that is resident on the surface of the layer being etched because of the adsorbed layer. Therefore, the adsorbed layer on the surface of the layer being etched may be thicker (in comparison to typical approaches) while lowering the amount of surface tension that maybe present.

Although specific embodiments have been illustrated and described herein, it will be appreciated by those of ordinary skill in the art that any arrangement which is calculated to achieve the same purpose may be substituted for the specific embodiments shown. Adaptations of the invention will be apparent to those of ordinary skill in the art. For example, while described with reference to etching of layers that are adjacent to memory containers (having double-sided containers in the side wall), embodiments of the invention may be applicable to other structures wherein the amount of surface tension is to remain low to preclude damage to surrounding/adjacent structures. Accordingly, this application is intended to cover any adaptations or variations of the invention. It is manifestly intended that this invention be limited only by the following claims and equivalents thereof

What is claimed is:

1. A method comprising:
providing a semiconductor substrate that includes a memory container including a double-sided capacitor; and
vapor phase etching a layer adjacent to a side wall of the memory container with a vapor including a surface tension lowering agent.

2. The method of claim 1, wherein the vapor phase etching comprises vapor phase etching the layer adjacent to the side wall of the memory container with the vapor including a carboxylic.

3. The method of claim 1, wherein the vapor phase etching comprises vapor phase etching an oxide layer adjacent to the side wall of the memory container.

4. The method of claim 1, wherein the vapor phase etching comprises vapor phase etching a borophosphosilicate glass (BPSG) material adjacent to the side wall of the memory container.

5. The method of claim 1, wherein the vapor phase etching comprises vapor phase etching the layer adjacent to the side wall of the memory container with the vapor including hydrogen fluoride and an etch initiator composition.

6. A method comprising:
providing a semiconductor substrate that includes a double-sided capacitor memory container; and
etching a layer adjacent to a side wall of the double-sided capacitor memory container with vapor comprising vapor for reducing surface tension that includes methanol.

7. The method of claim 6, wherein the etching comprises etching an insulator layer adjacent to the side wall of the double-sided capacitor memory container with the vapor comprising vapor for reducing surface tension that includes methanol.

8. The method of claim 6, wherein the etching comprises etching a doped oxide layer adjacent to the side wall of the double-sided capacitor memory container with the vapor comprising vapor for reducing surface tension that includes methanol.

9. The method of claim 6, wherein the etching comprises etching an insulator layer adjacent to the side wall of the double-sided capacitor memory container with the vapor comprising vapor for reducing surface tension that includes hydrogen fluoride.

10. A method of fabricating a semiconductor circuit element, the method comprising:
placing a semiconductor substrate that includes a double-sided capacitor container in a chamber; and
vapor phase etching a layer adjacent to a side wall of the double-sided capacitor container with a vapor that includes hydrogen fluoride, an etch initiator composition and a surface tension lowering composition that includes an alcohol.

11. The method of claim 10, wherein the vapor phase etching comprises vapor phase etching an oxide layer adjacent to the side wall of the double-sided capacitor container with the vapor that includes hydrogen fluoride, the etch initiator composition and the surface tension lowering composition that includes alcohol.

12. The method of claim 10, wherein the vapor phase etching comprises vapor phase etching an insulator layer adjacent to the side wall of the double-sided capacitor container with the vapor that includes hydrogen fluoride, the etch initiator composition and the surface tension lowering composition that includes alcohol.

13. The method of claim 10, wherein the vapor phase etching comprises vapor phase etching a layer adjacent to the side wall of the double-sided capacitor container with the vapor that includes hydrogen fluoride, the etch initiator composition and the surface tension lowering composition that includes methanol.

14. The method of claim 10, wherein the vapor phase etching comprises vapor phase etching a layer adjacent to the side wall of the double-sided capacitor container with the vapor that includes hydrogen fluoride, $H_2O$ and the surface tension lowering composition that includes isopropyl alcohol.

15. A method of fabricating an integrated circuit, the method comprising:
housing the integrated circuit in a vapor etch chamber; and
vapor phase etching an insulator layer formed adjacent to a double-sided capacitor container in the integrated circuit with a vapor including a surface tension lowering agent, wherein the vapor phase etching of the insulator layer comprises inserting a vapor comprised of a hydrogen fluoride and isopropyl alcohol into the vapor etch chamber.

16. The method of claim 15, further comprising heating the hydrogen fluoride and the isopropyl alcohol prior to inserting the vapor into the vapor etch chamber.

17. The method of claim 15, wherein the vapor phase etching comprises vapor phase etching a doped oxide layer formed adjacent to the double-sided capacitor container in the integrated circuit.

18. The method of claim 15, wherein the vapor phase etching comprises vapor phase etching a borophosphosilicate glass (BPSG) layer formed adjacent to the double-sided capacitor container in the integrated circuit.

19. The method of claim 15, wherein the inserting the vapor comprises inserting the vapor comprised of hydrogen fluoride, isopropyl alcohol and an etch initiator composition into the vapor etch chamber.

20. A method comprising:
placing a substrate that includes an array of memory into a chamber, the array of memory having at least one memory container with a side wall with an embedded capacitor; and
vapor phase etching of a layer of an insulator material formed adjacent to the side wall, wherein the vapor phase etching comprises:
mixing a hydrogen fluoride with a vapor including a surface tension lowering agent including isopropyl alcohol to form a mixed vapor; and
inserting the mixed vapor into the chamber.

21. The method of claim 20, further comprising heating the hydrogen fluoride and the isopropyl alcohol prior to inserting the mixed vapor into the vapor etch chamber.

22. The method of claim 20, wherein the mixing comprises mixing the hydrogen fluoride, the isopropyl alcohol and an etch initiator composition to form the mixed vapor.

23. The method of claim 20, wherein the vapor phase etching comprises vapor phase etching of a layer of oxide formed adjacent to the side wall.

24. The method of claim 20, wherein the vapor phase etching comprises vapor phase etching of a layer of silicon dioxide formed adjacent to the side wall.

25. A method for fabricating a semiconductor substrate, the method comprising:
placing the semiconductor substrate that includes a memory container into a vapor etching chamber, wherein a side wall of the memory container includes a double-sided capacitor; and
vapor phase etching of a layer of an insulator material formed adjacent to the side wall of the memory container, wherein the vapor phase etching comprises:
mixing an etch initiator composition and surface tension reducing composition including hydrogen fluoride and alcohol to form a mixed vapor;
heating the mixed vapor; and
inserting the mixed vapor into the vapor etching chamber.

26. The method of claim 25, wherein the mixing comprises mixing the etch initiator composition and the surface tension reducing composition including hydrogen fluoride and methanol to form the mixed vapor.

27. The method of claim 25, wherein the mixing comprises mixing the etch initiator composition and the surface tension reducing composition including hydrogen fluoride and isopropyl alcohol to form the mixed vapor.

28. The method of claim 25, wherein the vapor phase etching comprises vapor phase etching of a layer of silicon nitride formed adjacent to the side wall of the memory container.

29. The method of claim 25, wherein the vapor phase etching comprises vapor phase etching of a layer of silicon oxynitride formed adjacent to the side wall of the memory container.

30. A method comprising:
placing a semiconductor substrate into a chamber; and
vapor phase etching of an insulator material formed adjacent to a double-sided container on a semiconductor substrate, wherein the vapor phase etching comprises:
forming a vapor that includes an $H_2O$ vapor, an HF gas and a surface tension lowering agent; and
inserting the vapor into the chamber.

31. The method of claim 30, wherein the forming comprises forming the vapor that includes $H_2O$, hydrogen fluoride and carboxylic.

32. The method of claim 30, wherein the forming comprises forming the vapor that includes $H_2O$, hydrogen fluoride and alcohol.

33. The method of claim 30, wherein the forming comprises forming the vapor that includes $H_2O$, hydrogen fluoride and isopropyl alcohol.

34. The method of claim 30, wherein the forming comprises forming the vapor that includes $H_2O$, hydrogen fluoride and methanol.

35. The method of claim 30, wherein the vapor phase etching comprises vapor phase etching of a silicon dioxide material formed adjacent to the double-sided container on the semiconductor substrate.

36. The method of claim 30, wherein the vapor phase etching comprises vapor phase etching of a doped oxide material formed adjacent to the double-sided container on the semiconductor substrate.

37. A method for fabricating a memory array, the method comprising:
forming at least one memory container in a borophosphosilicate glass (BPSG) material on a substrate, wherein a side wall of the at least one memory container includes a double-sided capacitor; and
removing at least a part of the BPSG material based on a vapor wet etch operation with a vapor including a surface tension lowering agent comprising hydrogen fluoride and alcohol.

38. The method of claim 37, wherein the removing comprises removing the at least a part of the BPSG material based on the vapor wet etch operation with the vapor including a surface tension lowering agent comprising hydrogen fluoride and isopropyl alcohol.

39. The method of claim 37, wherein the removing comprises removing the at least a part of the BPSG material based on the vapor wet etch operation with the vapor including a surface tension lowering agent comprising hydrogen fluoride and methanol.

40. A method comprising:
forming at least one memory container in an oxide, wherein a side wall of the at least one memory container includes a double-sided capacitor; and
vapor wet etching of a layer of the oxide with a vapor comprised of hydrogen fluoride, an etch initiator composition and a surface tension lowering agent.

41. The method of claim 40, wherein the forming the at least one memory container comprises forming the at least one memory container in silicon oxide.

42. The method of claim 40, wherein the vapor wet etching comprises vapor wet etching with a vapor comprised of hydrogen fluoride, the etch initiator composition and an alcohol.

43. The method of claim 40, wherein the vapor wet etching comprises vapor wet etching with a vapor comprised of hydrogen fluoride, the etch initiator composition and isopropyl alcohol.

44. The method of claim 40, wherein the vapor wet etching comprises vapor wet etching with a vapor comprised of hydrogen fluoride, the etch initiator composition and methanol.

* * * * *